United States Patent [19]
Wang et al.

[11] Patent Number: 5,841,482
[45] Date of Patent: Nov. 24, 1998

[54] TRANSITION ALIGNED VIDEO SYNCHRONIZATION SYSTEM

[75] Inventors: Niantsu N. Wang, Milpitas; Sherman Tan King, San Francisco; Guorjuh T. Hwang, Milpitas, all of Calif.

[73] Assignee: AuraVision Corporation, Fremont, Calif.

[21] Appl. No.: 768,361

[22] Filed: Dec. 16, 1996

Related U.S. Application Data

[62] Division of Ser. No. 509,912, Aug. 1, 1995, abandoned.

[51] Int. Cl.$^6$ .................................................. H04N 9/475
[52] U.S. Cl. .......................... 348/537; 327/152; 327/153; 348/512
[58] Field of Search .................................. 348/512, 513, 348/515, 516, 518, 536, 537, 510; 327/152, 153, 161, 162; 375/362; H04N 9/475

[56] References Cited

U.S. PATENT DOCUMENTS

| | | | |
|---|---|---|---|
| 4,617,679 | 10/1986 | Brooks | 375/119 |
| 4,623,925 | 11/1986 | Tults | 358/183 |
| 4,675,612 | 6/1987 | Adams et al. | 328/63 |
| 4,713,621 | 12/1987 | Nakamura et al. | 328/55 |
| 4,757,264 | 7/1988 | Lee et al. | 328/63 |
| 4,791,488 | 12/1988 | Fukazawa et al. | 358/149 |
| 4,814,879 | 3/1989 | McNeely | 358/148 |
| 4,864,401 | 9/1989 | Kawata et al. | 358/148 |
| 4,907,083 | 3/1990 | Claude et al. | 358/148 |
| 4,908,842 | 3/1990 | Collins | 375/119 |
| 5,497,115 | 3/1996 | Millar et al. | 327/211 |

*Primary Examiner*—Michael H. Lee
*Attorney, Agent, or Firm*—Skjerven, Morrill, MacPherson, Franklin & Friel; Brian D. Ogonowsky; David T. Millers

[57] ABSTRACT

A synchronization system aligns video signals without the use of a phase locked loop. One embodiment includes a delay line and a selection circuit. A clock signal with a desired frequency for a pixel clock is applied to the delay line to generate a series of delayed signals at taps on the delay line. When a transition in a horizontal sync signal occurs, the selection circuit senses delayed signals and selects a delayed signal having a transition aligned relative to the transition in the horizontal sync signal. This delayed signal is a pixel clock signal which is not subject to frequency fluctuation of a phase locked loop. Selecting a new delayed signal at each horizontal blanking period keeps the pixel clock for each line of video aligned to the horizontal sync signal.

9 Claims, 9 Drawing Sheets

TRANSITION ALIGNED VIDEO SYNCHRONIZATION SYSTEM

This application is a division of U.S. application Ser. No. 08/509,912, filed Aug. 1, 1995, since abandoned.

CROSS REFERENCE TO RELATED APPLICATION

This application is related to U.S. application Ser. No. 08/127,219, filed Sep. 27, 1993, entitled "Flexible Multiport Multiformat Burst Buffer" now U.S. Pat. No. 5,442,747 issued on Aug. 15, 1995; U.S. application Ser. No. 08/136,621, filed Oct. 13, 1993, entitled "Data Processing Technique for Limiting the Bandwidth of Data to be Stored in a Buffer" now U.S. Pat. No. 5,463,422 issued on Oct. 31, 1995; U.S. application Ser. No. 08/142,623, filed Oct. 22, 1993, entitled "Video Processing Technique Using Multi-Buffer Video Memory" now U.S. Pat. No. 5,568,165 issued on Oct. 22, 1996; and U.S. application Ser. No. 08/354,188, filed Dec. 12, 1994, entitled "Automatic Alignment of Video Window on a Multimedia Screen" now U.S. Pat. No. 5,621,428 issued on Apr. 15, 1997. All four applications are incorporated herein by reference in their entirety.

BACKGROUND OF THE INVENTION

1. Field of the Invention

This invention relates to circuits and processes which synchronize video signals.

2. Descripltion of Related Art

Some multimedia computer systems contain a video source such as a video camera, a television tuner, or a CD ROM drive which generates information representing a moving image. A motion video card converts the information to a video signal for displaying the moving image in a video window on a display screen which concurrently displays conventional graphics such as text around the video window. U.S. application Ser. No. 08/354,188, now U.S. Pat. No. 5,621,428 which is incorporated by reference herein, describes multimedia systems where a computer and a VGA card generate a video signal representing a graphics image, and a motion video card receives the video signal and replaces the portion of the video signal that represents a video window with a new portion representing a moving image.

FIG. 1A shows an example of a multimedia system 100 having a motion video card 12 which produces an analog RGB video signal by combining a digital video signal from a VGA card 20 with a digital video signal represent a moving image. Each digital video signal contains a stream of pixel data representing the colors of pixels in lines of frames to be displayed on a monitor 30. To generate the output video signal, a multiplexer 38 selects digital pixel data from a motion video buffer 14 when comparator 46 indicates the pixel data from VGA card 20 is equal to a particular color or chroma key and otherwise selects pixel data from VGA card 20. A digital-to-analog (D/A) converter 40 converts the pixel data from multiplexer 38 into an analog RGB video signal.

VGA card 20 and motion video card 12 typically use different pixel clock signals when asserting pixel data to multiplexer 38 and D/A converter 40. VGA card 20 generates a pixel clock signal and a horizontal synchronization signal which are synchronized so that each line of pixel data for the graphics image is aligned horizontally at a left edge of the display area on monitor 30. Motion video card 12 generates its own pixel clock signal. If the phase of the pixel clock signal for motion video card 12 varies relative to the horizontal synchronization signal, the timing of pixel data for the moving image varies relative to the timing of pixel data for the graphic image, and the positions of the pixels displayed in the video window vary relative to the starts of lines on monitor 30. This makes the moving image appear blurry and jittery.

FIG. 1B shows an example of a multimedia system 150 which combines two analog video signals to produce an output RGB video signal. Although both video signals are analog, motion video card 120 his a D/A converter 66 which converts pixel data according to a pixel clock signal generated by a video clock 64. The pixel clock signal is synchronized with a horizontal synchronization signal from VGA card 54 to avoid the jitter described above.

Typically, a motion video card such as card 12 or 120 contains a phase locked loop (PLL) to synchronize the card's pixel clock signal with the horizontal synchronization signal from a VGA card. Designing an adequately accurate PLL presents challenges. In particular, computer systems provide an electrically noisy environment for motion video cards and disturb PLL operation. Additionally, a pixel clock signal typically has a frequency that is hundreds or thousands of times the frequency of the horizontal synchronization signal, and small jitter in the horizontal synchronization signal or the PLL operation causes significant variations in the phase and frequency of the pixel clock signal. The variation in the phase causes lines of the moving image to have variable display positions as described above. The variation in frequency varies the displayed length of the lines of the moving image which also causes a blurry and jittery moving image. Accordingly, circuits and methods are desired for synchronizing pixel clock signals to horizontal synchronization signals without. variations in the pixel clock signal's frequency or phase relative to the horizontal synchronization signal.

SUMMARY OF THE INVENTION

In accordance with an embodiment of the invention, a synchronization circuit includes a delay line and a selection circuit. A clock signal applied to the delay line generates a series of delayed signals at a series of taps on the delay line. All of the delayed signals have the same frequency but differ in phase. The selection circuit monitors the delayed signals and selects a tap which supplies a clock signal having a transition aligned with a transition in a reference signal. The selected tap is the source of an aligned clock signal until a new tap is selected. Periodic alignment selects a new tap at periodic transitions in the reference signal and renews a desired phase relationship between the aligned clock signal and the reference signal. Jitter in the reference signal does not change the frequency of the aligned clock signal. Accordingly, the aligned clock signal has a constant frequency except during periods when the selection circuit selects a new tap.

In an application to video signals, the reference signal is either a horizontal synchronization signal or is derived from a horizontal synchronization signal, and the aligned clock signal is an aligned pixel clock signal. The aligned pixel clock signal is aligned to periodic transitions at edges of horizontal blanking intervals so that pixel data for every line of video has the same timing relative to the edge of a display. The frequency of the aligned pixel clock signal is not subject to jitter introduced by a phase locked loop. Accordingly, the aligned pixel clock signal allows display of clear and jitter free video.

In one embodiment of the invention, the selection circuit includes a series of latches that are coupled to taps on the delay line. Typically, the latches are dynamic latches which compare the voltage at a tap to a mean voltage of an input clock signal propagating on the delay line. A transition in a reference signal triggers the latches and causes each latch to provide an output signal which indicates the voltage at the tap when the latch was triggered. The selection circuit also contains a control circuit coupled to the latches and the taps. The control circuit identifies a pair of latches which have output signals indicating that when the latches were triggered, a voltage transition on the delay line was between the taps corresponding to the pair of latches. The control circuit selects a delayed signal and a tap according to the identified pair of latches. For example, the selected tap can be either of the taps corresponding to the pair of latches or a tap between the taps corresponding to the pair of latches.

The delay line typically contains a series of delay elements such as inverters which control the total delay time required for a signal to traverse the delay line. A delay control circuit can control the delay through each delay element and the total delay time. To provide a full range of phases to select from, the total delay time is longer than the period of the input clock signal applied to the delay line.

A pixel clock signal which is synchronized with a horizontal synchronization signal can be generated using a method which includes: applying a clock signal to a delay line to generate a series of delayed signals at taps on the delay line; selecting one of the delayed signals which has a desired phase relative to the horizontal synchronization signal; and using the selected one of the delayed signals as the pixel clock signal.

BRIEF DESCRIPTION OF THE DRAWINGS

FIG. 5 is a key to FIGS. 5A and 5B, which together shows a section of a delay line and select circuitry.

FIG. 6 shows a circuit which generates reference signals from a horizontal synchronization signal.

FIG. 8 shows selection circuitry for six delay line sections such as shown in FIG. 5.

FIG. 9 shows a deglitcher which removes short pulses from an output pixel clock signal.

Use of the same reference symbols in different figures indicates similar or identical items.

DETAILED DESCRIPTION OF THE PREFERRED EMBODIMENTS

In accordance with an embodiment of the invention, a synchronization circuit generates a pixel clock signal which, at the start of each line of video, has a desired phase relative to a horizontal synchronization signal. The synchronization circuit contains a delay line on which an input clock signal propagates and a selection circuit that, at the start of each line of video, selects a tap on the delay line where a delayed signal has the desired phase. The synchronization circuit maintains the frequency of the pixel clock signal as generated by a clock circuit such as a crystal oscillator. This eliminates jitter caused when a phase locked loop varies frequency to obtain a phase lock.

Figure 2:
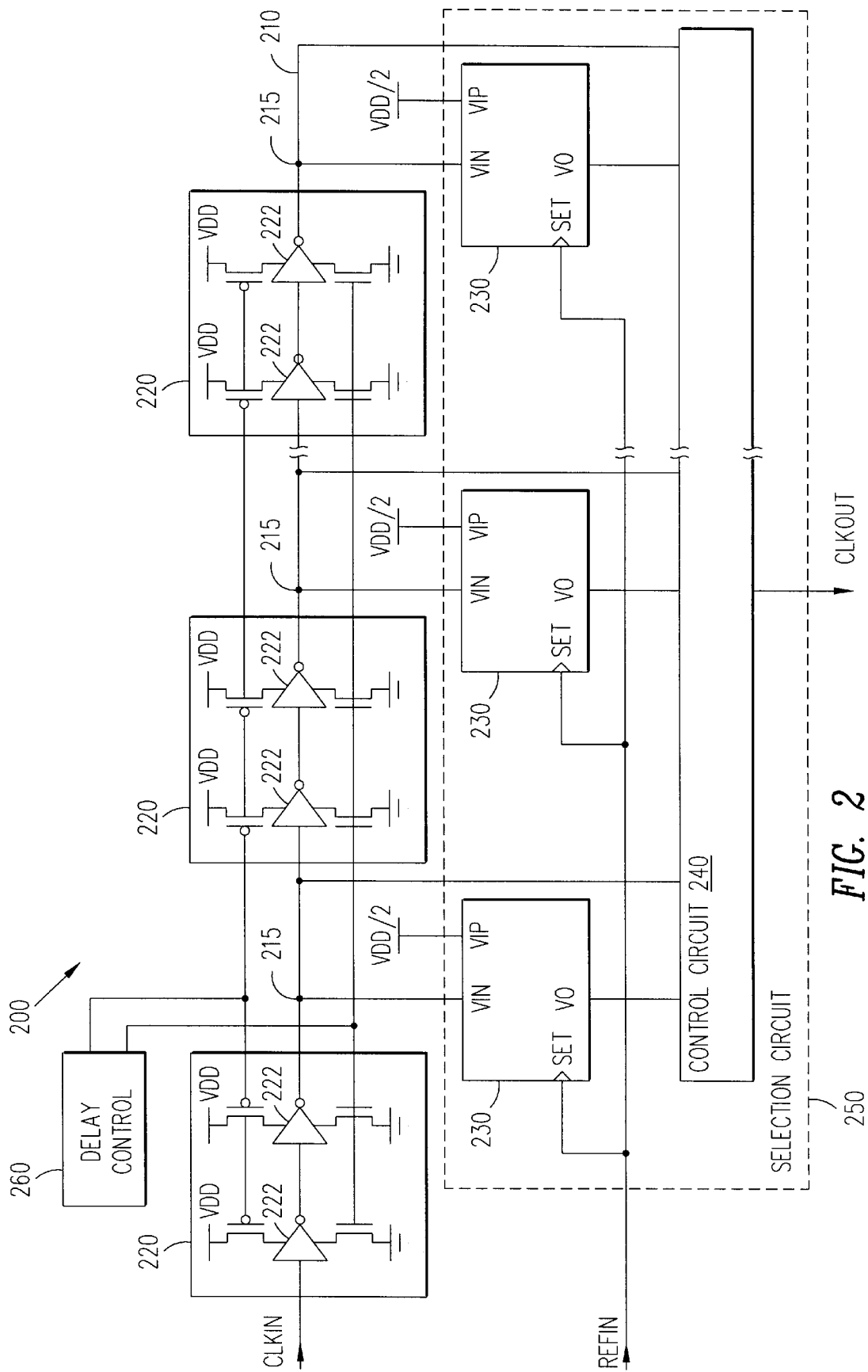
FIG. 2 shows a block diagram of a synchronization circuit in accordance with an embodiment of the invention.

FIG. 2 is a block diagram of a synchronization (sync) circuit 200 in accordance with an embodiment of the invention. Sync circuit 200 contains a delay line 210 and a selection circuit 250 connected to a series of taps 215 along delay line 210. A conventional oscillator (not shown) asserts an input clock signal CLKIN to delay line 210. Clock signal CLKIN has a desired frequency for an output clock signal CLKOUT but may not have a desired phase relative to reference signal REFIN. Clock signal CLKIN propagates along delay line 210, so that each tap 215 provides a delayed signal which has the same frequency as signal CLKIN but a phase which differs from signal CLKIN. Selection circuit 250 selects one tap 215 which provides a signal having a phase close to the desired phase relationship with reference signal REFIN. That tap provides synchronized clock signal CLKOUT.

To ensure that at least one of the delayed signals from taps 215 has approximately the desired phase, the total delay of delay line 210 should be greater than the period of signal CLKIN so that taps 215 sample the full range of possible phases. In FIG. 2, delay line 210 contains delay cells 220 which are connected in series. Delay cells 220 delay propagation of signal CLKIN and control the phase difference between signals at adjacent taps 215. In FIG. 2, each delay cell 220 contains two inverters 222 coupled in series and provides a delay which depends on the fabrication parameter of inverters 222 and the power applied to the inverters. Many other alternative delay cells are possible. A delay control circuit 260 creates a programmable current supply which powers inverters 222 for current starved operation and a user selected delay. Delay control 260 can be programmed so that the total delay of delay line 210 is equal to the period of signal CLKIN.

Selection circuit 250 contains a control circuit 240 and dynamic latches 230 which sense delayed signals at taps 215 on delay line 210. Each latch has two input terminals, one coupled to a corresponding tap 215 and the other coupled to a reference voltage VDD/2 which is mean voltage of clock signal CLKIN. In operation, a transition (or edge) in reference signal REFIN triggers latches 230, and an output voltage from each latch 230 goes high if the delayed signal at the corresponding tap 215 is higher than voltage VDD/2 when latches 230 were triggered.

Figure 3:
FIG. 3 represents the values held in latches in an embodiment of the synchronization circuit of FIG. 2.

FIG. 3 shows an example pattern of the values (high=1, low=0) in latches 230 after being triggered by signal REFIN. In the example, each of the first J latches 230 and each of the last (N–K) latches 230 contains value 0 indicating the delayed signal at a corresponding tap 215 was at a level below voltage VDD/2 when latches 230 were triggered. Each of the remaining (K–J) latches 230 contains value 1 indicating the delayed signals at a corresponding tap 215 was above voltage VDD/2 when latches 230 were triggered. The values in latches 230 indicate the progress of signal CLKIN along delay line 210. In the example of FIG. 3, a rising edge of signal CLKIN has passed latch K but has not yet reached latch K+1, and a falling edge of signal CLKIN is between latch J and latch J+1. If it is desired that the rising edge of signal CLKOUT be in phase-with the triggering edge of signal REFIN, control circuit 240 selects the delayed signals from a tap near the taps 215 sensed by latches K and K+1. The delayed signal for that tap is aligned with the edge of signal REFIN to an accuracy of about the delay of one delay cell 220. Decreasing the delay per delay cell 220 and increasing the number of taps increase the accuracy of the alignment between reference signal REFIN and output clock signal CLKOUT.

Figure 4:
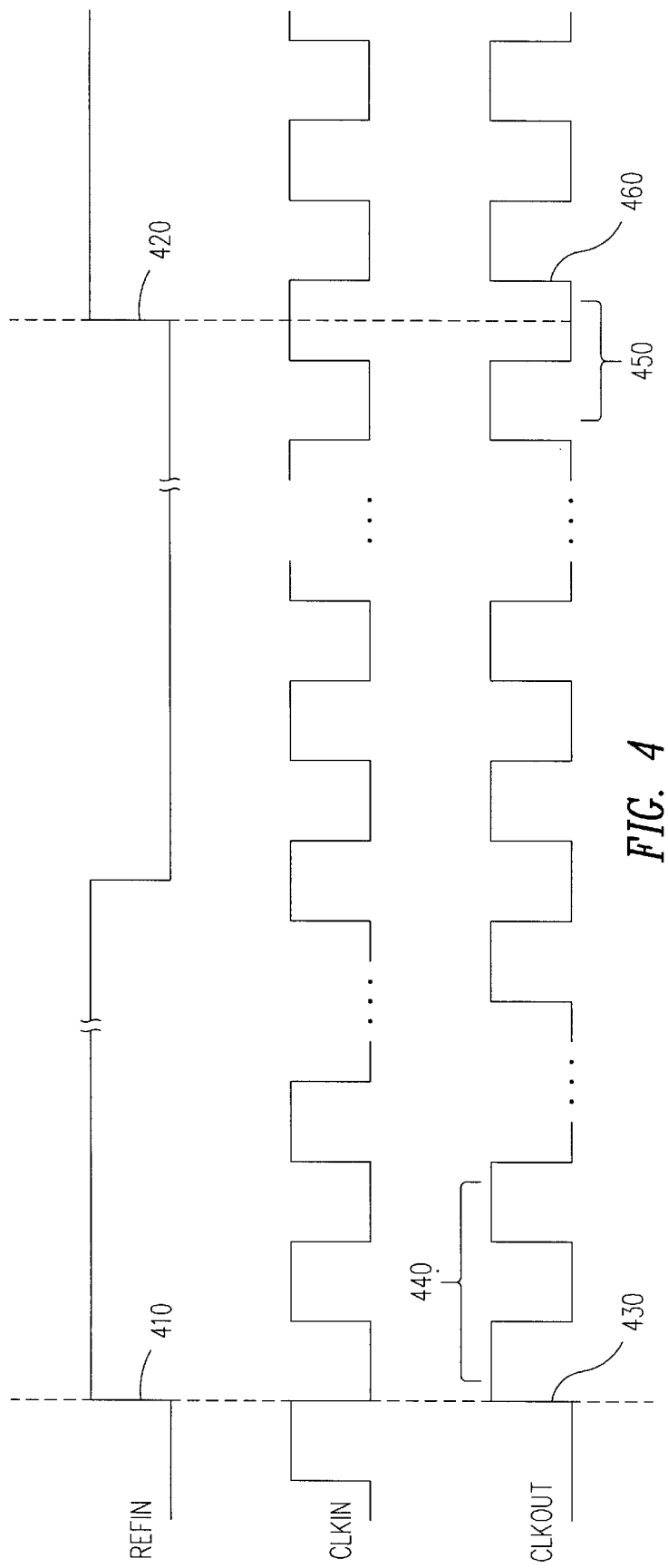
FIG. 4 shows timing diagrams of input and output signals in an embodiment of the synchronization circuit of FIG. 2.

FIG. 4 shows the timing of signals REFIN, CLKIN, and CLKOUT in an embodiment of sync circuit 200, wherein a rising edge of signal REFIN triggers latches 230 and selection circuit 250 aligns signal CLKOUT to the rising edge of signal REFIN. Phase synchronization occurs at an edge 410 of reference signal REFIN when control circuit 240 selects a delayed signal which had a rising edge occurring at the same time as edge 410. An edge 430 of clock signal CLKOUT occurs after the time required for control circuit 240 to select one of taps 215. The selected tap 215 provides signal CLKOUT until another rising edge 420 again triggers latches 230. There is no requirement that the frequency of signal CLKIN be an integer multiple of signal REFIN. Accordingly, the signal from the tap selected at edge 410 usually does not have an edge aligned with edge 420 of signal REFIN. At edge 420, control circuit 240 selects another tap 215 which provides a delayed signal aligned with edge 420.

A first period 440 and a last period 450 in output signal CLKOUT, between edges 410 and 420 are typically irregular. For example, first period 440 is shorter than normal because edge 430 is delayed while a tap is selected. Last period 450 of signal CLKOUT before edge 420 is short because a new tap is selected and an edge 460 from the new tap begins before a full period from the old tap ends. If the signal from the old tap is high when a new tap is selected, a long pulse occurs. If desired, signal CLKOUT can be filtered to remove short pulses or glitches caused by switching taps.

Figure 1A:
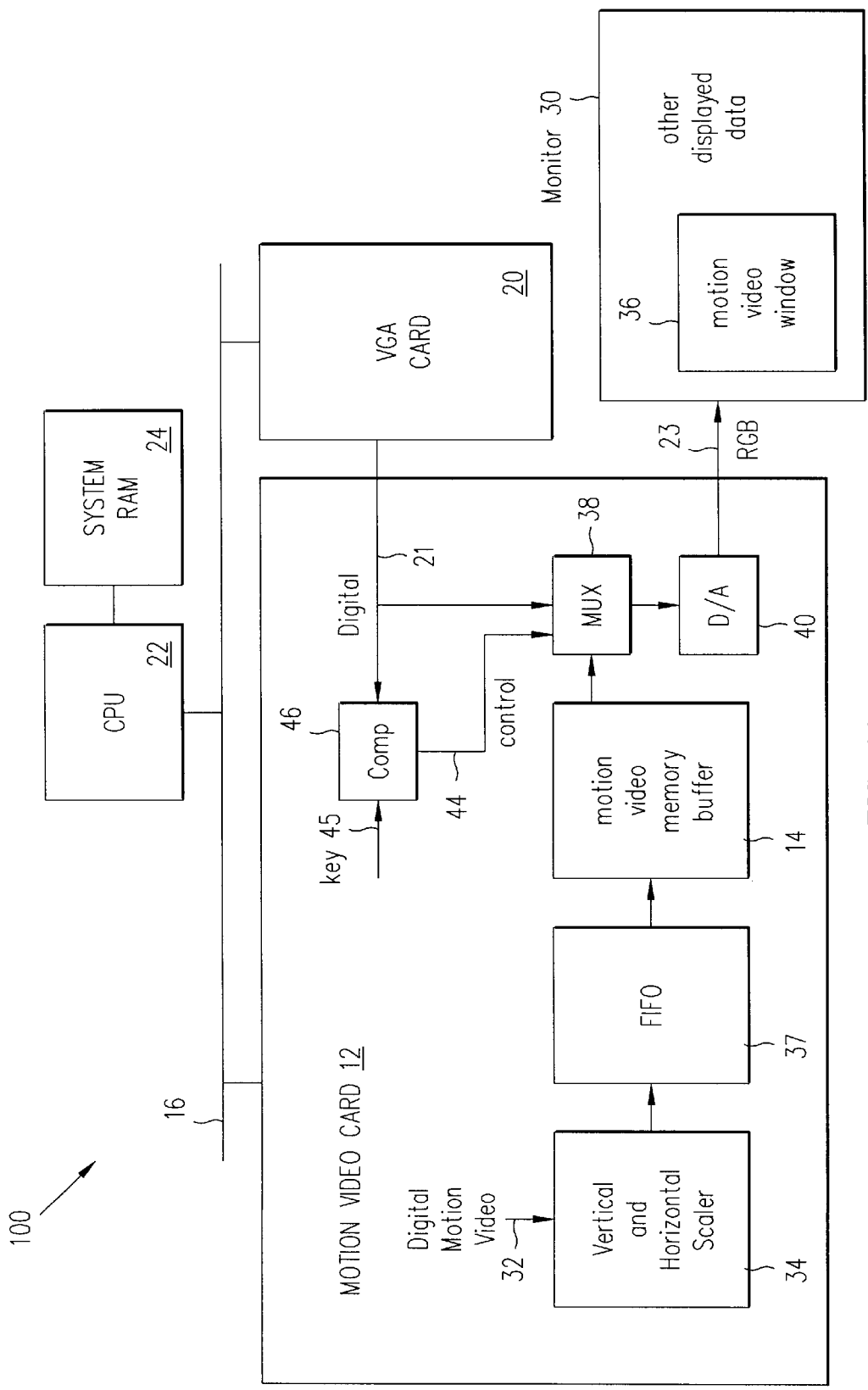
FIG. 1A shows a block diagram of a multimedia system containing a motion video card which multiplexes digital video signals.
Figure 1B:
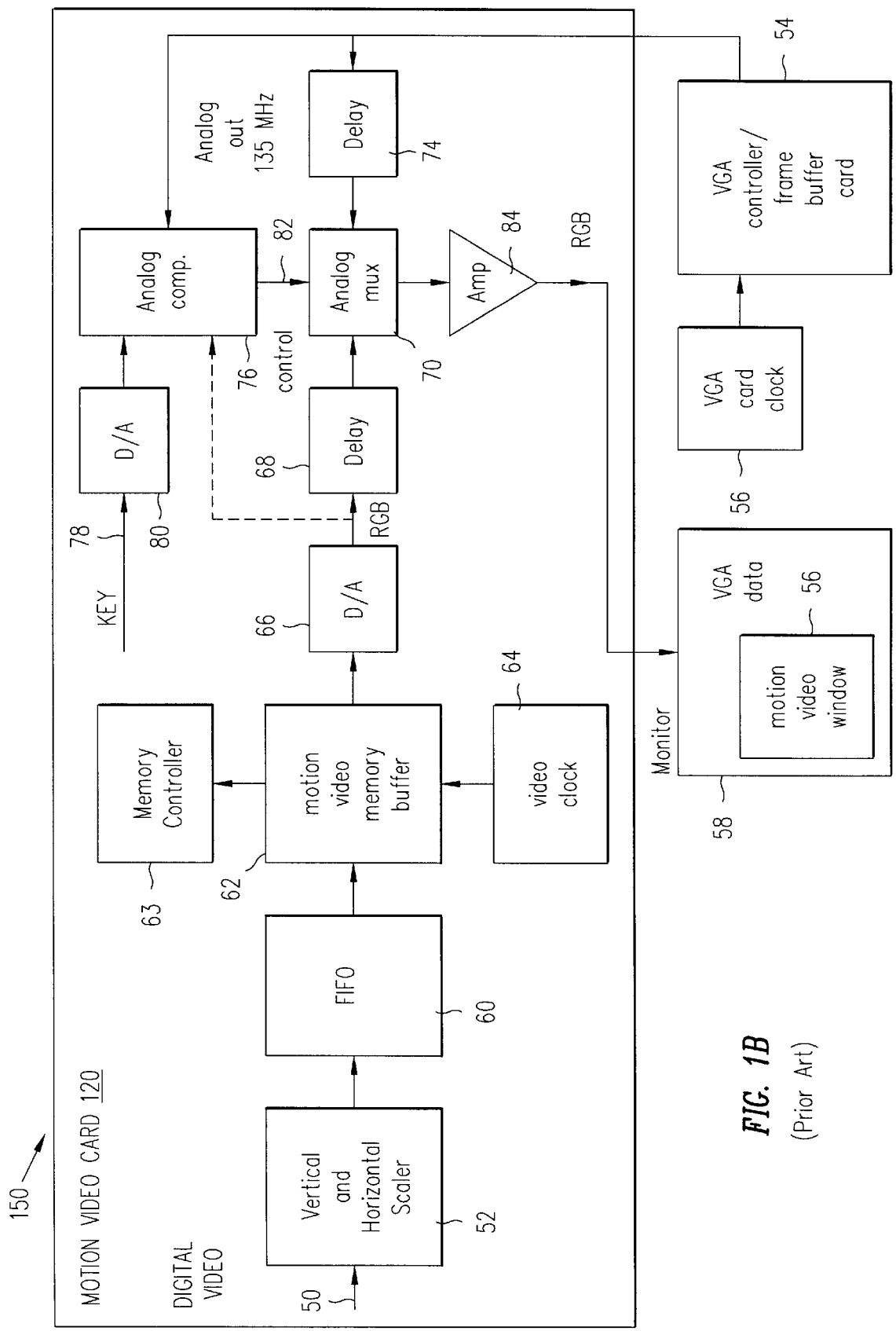
FIG. 1B shows a block diagram of a multimedia system containing a motion video card which multiplexes analog video signals.

Sync circuit 200 of FIG. 2 may be applied in any application where a signal that has a phase initially or periodically synchronized with a reference signal is desired. One preferred application is in motion video card 120 of FIG. 1B. Motion video card 120 contains elements which are identical to and have the same references numbers as elements shown in FIG. 3 of U.S. patent application Ser. No. 08/354,1818. The description of those elements applies to FIG. 1B.

In motion video card 120, signal REFIN is or is derived from the horizontal synchronization signal from VGA controller 54, and signal CLKOUT is the pixel clock signal which controls the timing of pixel data asserted from motion video buffer 62 to D/A converter 66. The pixel clock signal is realigned with an edge of each horizontal blanking interval which gives lines of the moving image a uniform horizontal position relative to the edge of the display. Additionally, the lengths of lines of the moving image are steady because the pixel clock signal's frequency does not vary with jitter in the horizontal synchronization signal or in a phase locked loop.

Irregular periods such as periods 440 and 450 of FIG. 4 do not affect the display video because the irregular periods occur near the beginning or the end of horizontal blanking intervals when motion video buffer 62 supplies no pixel data. Accordingly, the periods which may be short or irregular are not used for pixel timing and do not affect the display. The time in which the pixel data is not required (several microseconds for a typical horizontal blanking interval and the delay before the active display) is available for selecting a tap 215 and is large when compared with the speed of CMOS circuit elements in selection circuit 250.

FIGS. 5A, 5B, 6, 8, and 9 are circuit diagrams for an exemplary embodiment of the invention. The exemplary embodiment generates a pixel clock signal having a phase synchronized with a horizontal sync signal.

Figure 5A:
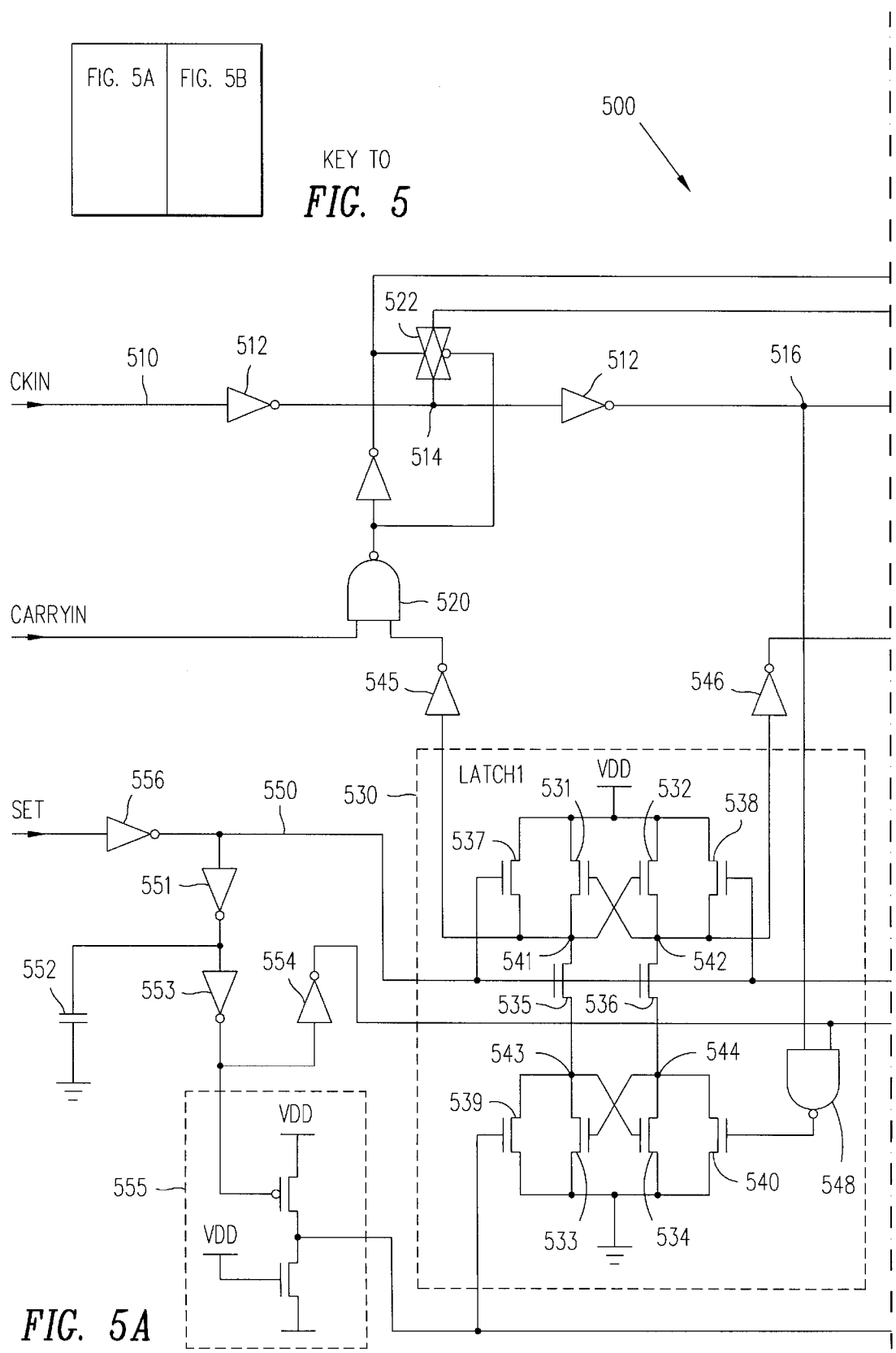
FIGS. 5A, 5B, 6, 8, and 9 are circuit diagrams of portions of a synchronization circuit in accordance an exemplary embodiment of the invention.
Figure 5B:
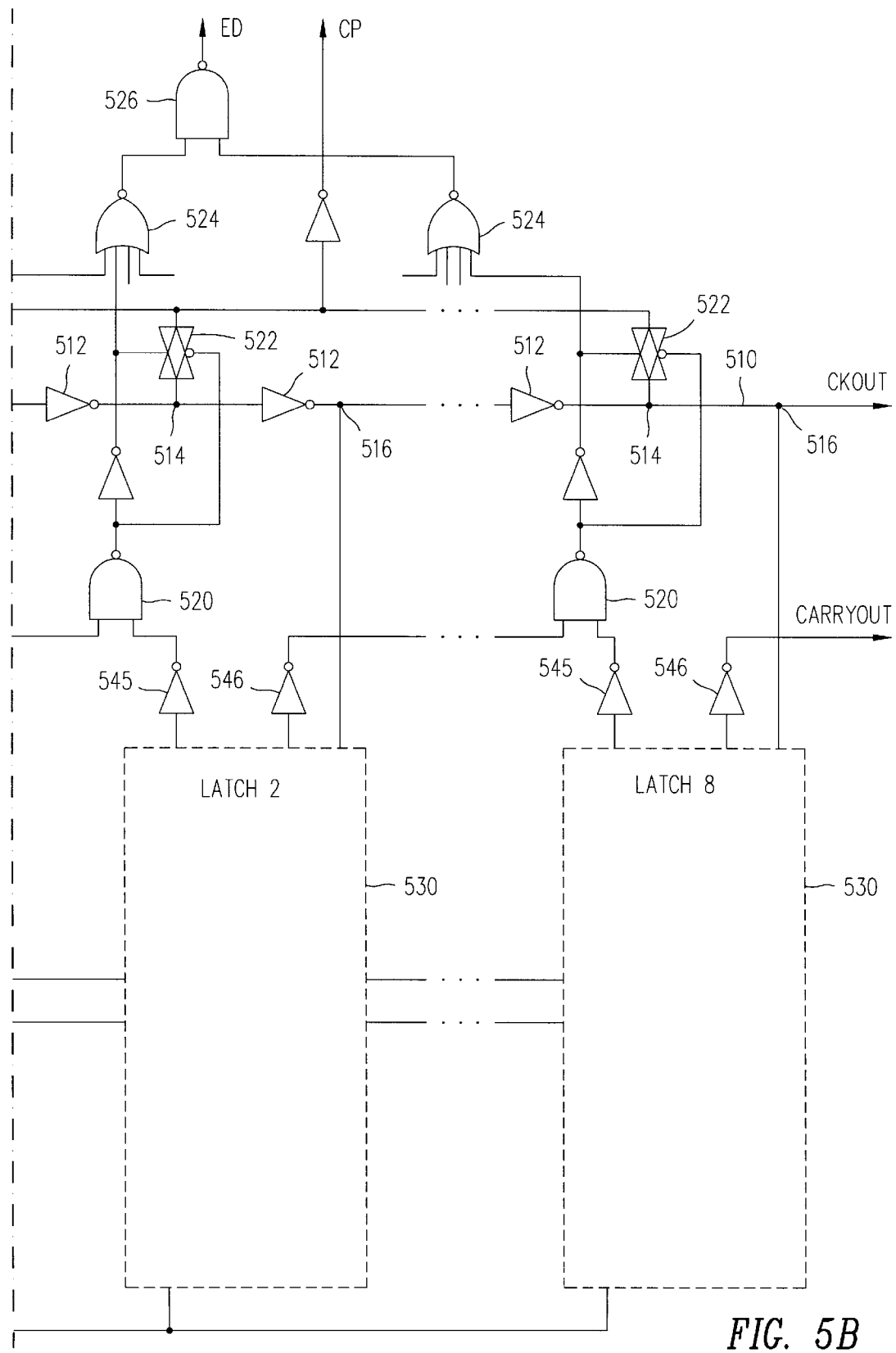
Figure 6:
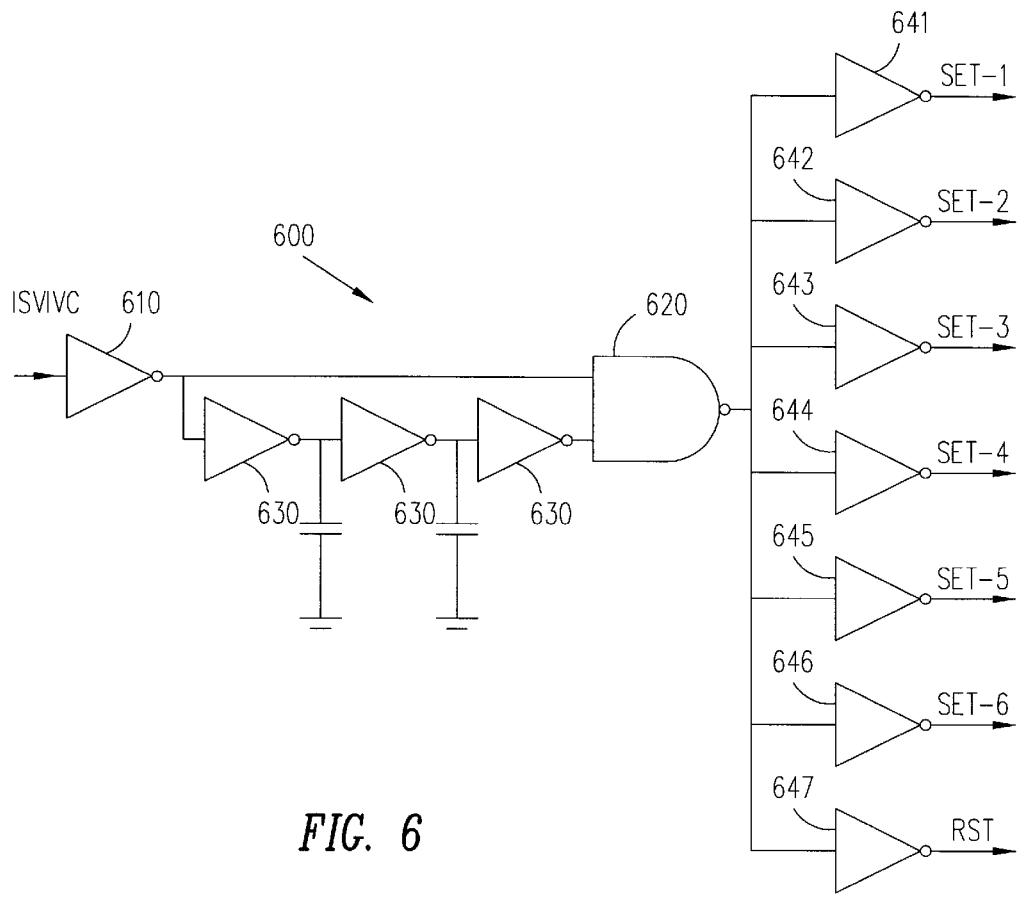

FIG. 5 is a key to FIGS. 5A and 5B, which together shows a section of a delay line 510. In the exemplary embodiment, the delay line 510 contains a series of six identical sections 500, but alternatively any number of sections may be employed. An oscillator (not shown) generates a clock signal CKIN for input to the first section in the series, and each section of delay line 510, except the last, provides a signal CKOUT as the input signal CKIN to the next section in the series. Each section has accompanying selection circuitry which is identical to that shown in FIGS. 5A and 5B. In particular, each section of delay line 510 is coupled to eight dynamic latches 530, but more or fewer latches may be used in other embodiments of the invention.

Dynamic latches 530 detect voltages on delay line 510. With current CMOS technology, a dynamic latch can detect a voltage difference within a time interval down to the picosecond range and still avoid metastability problems. Each dynamic latch 530 contains P-channel transistors 531, 532, 537, and 538, N-channel transistors 533, 534, 535, 536, 539, and 540, and a NAND gate 548. P-channel transistors 531 and 532 are coupled between a supply voltage VDD and respective nodes 541 and 542 with gates cross-coupled to nodes 542 and 541 respectively. P-channel transistors 537 and 538 are also coupled between supply voltage VDD and nodes 541 and 542 respectively but have gates coupled to a line 550. N-channel transistors 535 and 536 connect nodes 541 and 542 to nodes 543 and 544 respectively and have gates coupled to line 550. N-channel transistors 533 and 534 are coupled between respective nodes 543 and 544 and ground and have gates cross-coupled to nodes 544 and 543 respectively. N-channel transistors 539 and 540 also connect nodes 543 and 544 to ground.

When latch 530 holds a stored value, the voltage on node 541 is complementary to the voltage on node 542. Setting voltage on line 550 low (about ground level) resets latch 530 so that the voltage on both nodes 541 and 542 is high (about level VDD). When the voltage on line 550 is low, transistors 535 and 536 disconnect nodes 541 and 542 from grounded portions of latch 530, and transistors 537 and 538 pull nodes 541 and 542 high. When the voltage on line 550 transitions from low to high, transistors 537 and 538 shut off, and transistors 535 and 536 turn on which charges nodes 543 and 544.

A voltage divider 555 supplies a voltage VDD/2 to the gate of transistor 539, and NAND gate 548 supplies a voltage from a tap 516 on delay line 510 to the gate of transistor 540. If the voltage from tap 516 is initially high, transistor 540 is off, and transistor 539 pulls node 541 low, turning on transistor 532. Transistor 532 drives nodes 542 and 544 high. Alternatively, if the voltage from delay line 510 is initially low, transistor 540 pulls node 544 low enough to turn on transistor 531 which drives nodes 541 high. Circuit elements 551 to 554 provide a delay for sensing the voltage on tap 516 before shutting off voltage divider 555 and causing NAND gate 548 to disconnect tap 516 from the gate of transistor 540. Nodes 541 to 544 retain the levels obtained during the sensing, until the voltage on line 550 goes low and resets latch 530.

Figure 7:
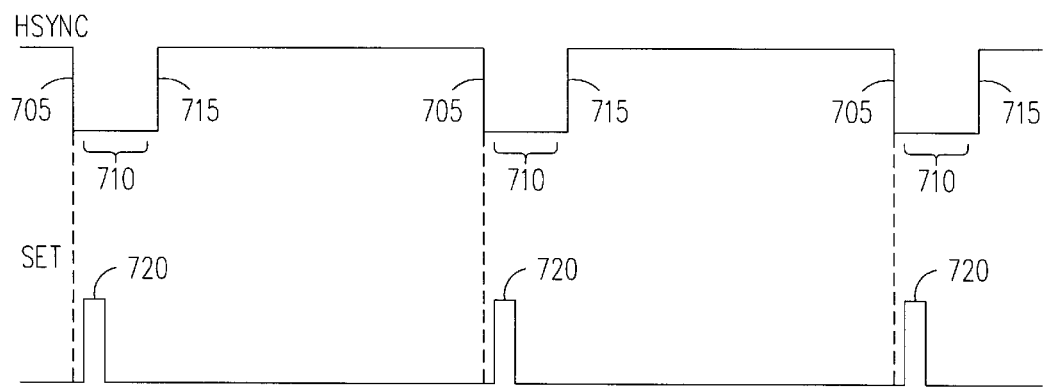
FIG. 7 shows the timing of input and output signals for the circuit of FIG. 6.

An inverter 556 inverts a signal SET to control the voltage on line 550. A one-shot circuit 600 shown in FIG. 6 generates signals SET_1 to SET_6 and RST which contain pulses aligned to an input horizontal synchronization signal HSYNC. Signals SET_1 to SET_6 correspond to respective sections of delay line 510. Signal RST is for a deglitcher 900 shown in FIG. 9 and described below. FIG. 7 shows the timing of input and output signals from one-shot circuit 600. A typical horizontal sync signal is low during blanking intervals 710 which are 3 to 6 $\mu$s long. Signal SET which resets and triggers latches 530 contains pulses 720 of much shorter duration, typically 30 to 60 ns, which are approximately aligned with falling edges 705 of signal HSYNC.

One-shot circuit 600 contains an input inverter 610, a NAND gate 620, an odd number of delay inverters 630, and output inverters 641 to 647. In a steady state, delay inverters 630 cause one input voltage of NAND gate 620 to be complementary to a second input voltage so that an output voltage from NAND gate 620 is high, and output signals RST and SET_1 to SET_6 from one-shot circuit 600 are low. Delay inverters 630 control the duration of pulses 720 which are generated when signal HSYNC transitions from high to low. In particular, inverter 610 raises an input voltage of NAND gate 620 before inverters 630 drop the other input voltage of NAND gate 620. Thus, both input voltages of NAND gate 620 are high for the delay time through inverters 630.

When signal SET sets a latch 530, voltage at node 541 is high and voltage at node 542 is low if the voltage sensed at tap 516 is low. Voltage at node 541 is low and voltage at node 542 is high if the voltage sensed at tap 516 is high. Between each pair of latches 530 is a NAND gate 520 which has one input terminal coupled through an inverter 546 to node 542 of a first latch and a second input terminal coupled through an inverter 545 to node 541 of a second latch. As described above, delay line 510 includes a series of six sections which are identical to the section shown in FIGS. 5A and 5B. The last latch 530 for each section, except the last section, provides a signal CARRYOUT from node 542, as an input signal CARRYIN to a NAND gate 520 in the next section. For a first section, signal CARRYIN is grounded.

Each NAND gate 520 shuts off a corresponding pass gate 522 unless the voltages at connected nodes 542 and node 541 are both low. For both voltages to be low, the first latch must have sensed a voltage that is low, and the second latch must have sensed a voltage that is high. When this occurs, a falling edge of signal CKIN has passed a tap 516 sensed by the first latch but had not reached a tap 516 sensed by the second latch. The pass gate 520 corresponding to that NAND gate 522 is coupled to a tap 514 which is between taps 516 sensed by latches 530. Accordingly, NAND gates 520 turn on only pass gates 522 connected to taps 514 having a delayed signal near a falling edge when latches 530 were set.

A pass gate 522 which is on conducts a delayed signal CP which had a falling edge approximately aligned with the falling edge of signal SET and therefore approximately aligned with fixed offset from falling edge 705 (FIG. 7) of signal HSYNC. Alternatively, clock signal CP may be aligned relative to rising edges 715 by changing one-shot circuit 600 to generate pulses aligned with rising edges 715. Aligning with falling edges 705 selects a tap during the horizontal blanking interval. Aligning on rising edges 715 selects a tap after the horizontal blanking period, but for a typical horizontal sync signal 1 to 3 $\mu$s are available for selecting a tap before pixel data is needed for the active display region. Either alternative provides a suitable pixel clock signal because the pixel clock signal and the horizontal sync signal can have any phase difference which is constant from line to line and still provide a jitter-free moving image.

The amount of delay in a section of delay line 510 is selected so that at most one pass gate 522 in a section is turned on. To accomplish this, the section must delay signal CKIN less than one period of the highest usable frequency for signal CKIN. In the exemplary embodiment, each inverter 512 has a delay of about 1 ns and each section of delay line 510 has a total delay of about 16 ns. Accordingly, the highest frequency for signal CKIN (and signal CP) is about 60 MHz. In this embodiment, the total delay of delay line 510 is about 96 ns, and the lowest usable frequency for signal CKIN is about 11 MHz.

When one of NAND gates 520 turns on the corresponding pass gate 522, logic gates 524 and 526 assert a signal ED high to indicate that the signal CP from that section is synchronized with signal HSYNC. Depending on the frequency of signal CKIN, one or more of the sections passes a synchronized signal CP and asserts signal ED. Typically, signals CP from different sections are not identical because synchronization is approximate to within a range provided by delay elements 512 in delay line 510. Accordingly, when more than one section provides a synchronized signal CP, only one is used.

Figure 8:
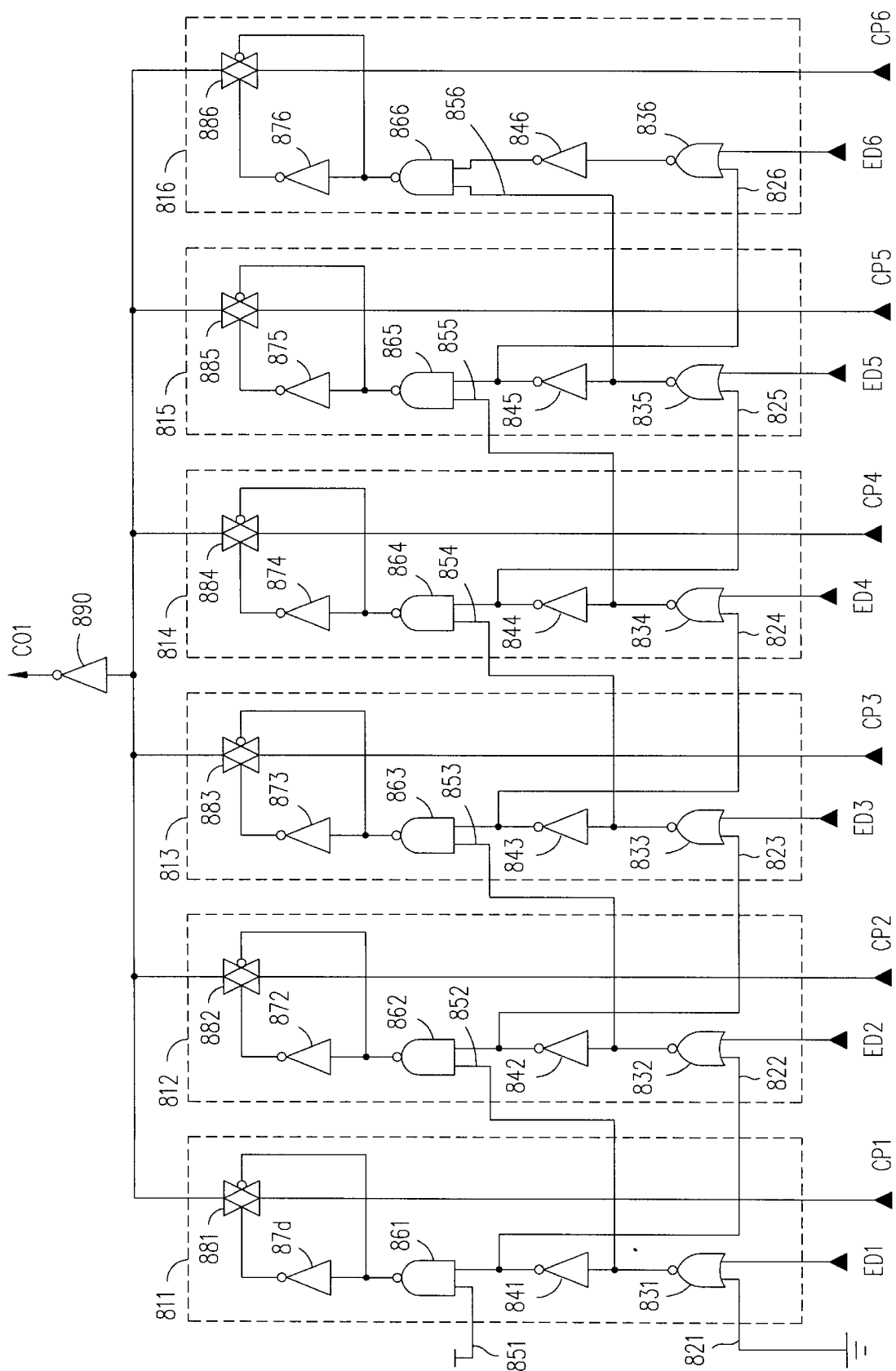

FIG. 8 shows a selection circuit 800 which selects one of signals CP1 to CP6 from six sections of delay line 510. Selection circuit 800 contains a series of six pass circuits 811 to 816. Pass circuit 811 to 816 pass the corresponding one of signals CP1 to CP6 if the pass circuit is enabled and if the corresponding one of signals ED1 to ED6 is asserted. To enable one of pass circuits 811 to 816, voltage on a respective one of input terminals 821 to 826 must be low and voltage on a respective one of input terminals 851 to 856 must be high.

The first pass circuit 811 has terminals 821 and 851 coupled to ground and VDD respectively aid is always enabled. If signal ED1 is asserted, an output voltage from a NOR gate 831 is low, and an output voltage from an inverter 841 is high. The high output voltage from inverter 841 causes an output voltage from a NAND gate 861 to be low which turns on a pass gate 881 which conducts signal CP1 to an inverter 890. The low and high output voltages from NOR gate 831 and inverter 841 respectively, which are connected to terminals 852 and 822 respectively, disable pass circuit 812. If signal ED1 is not asserted, the output voltage from NOR gate 831 is high and the output voltage from inverter 841 is low which enables pass circuit 812. The low output voltage from inverter 841 causes output voltage from NAND gate 861 to be high which shuts off pass gate 881.

Elements 822, 832, 842, 852, 862, 872, and 882 of pass circuit 812 are identical to respective elements 821, 831, 841, 851, 861, 871, and 881 of pass circuit 811 and operate in the same manner except that pass circuit 811 can disable pass circuit 812. When pass circuit 812 is disabled, pass gate 882 is off regardless of the state of signal ED2 because voltage on terminal 852 is low which keeps the output voltage of NAND gate 862 high. Additionally, output voltages from NOR gate 832 and inverter 842 are low and high respectively which disables pass circuit 813. Pass circuits 813 to 816 operate in the same manner as pass circuit 812, and when any one of pass circuits 812 to 815 is disabled the following pass circuits in the series are also disabled.

Accordingly, the first of pass circuit 811 to 816 to which a corresponding one of signals ED1 to ED6 is asserted disables the follow pass circuits in the series, and only one of pass gates 881 to 886 can be on at a time.

Figure 9:
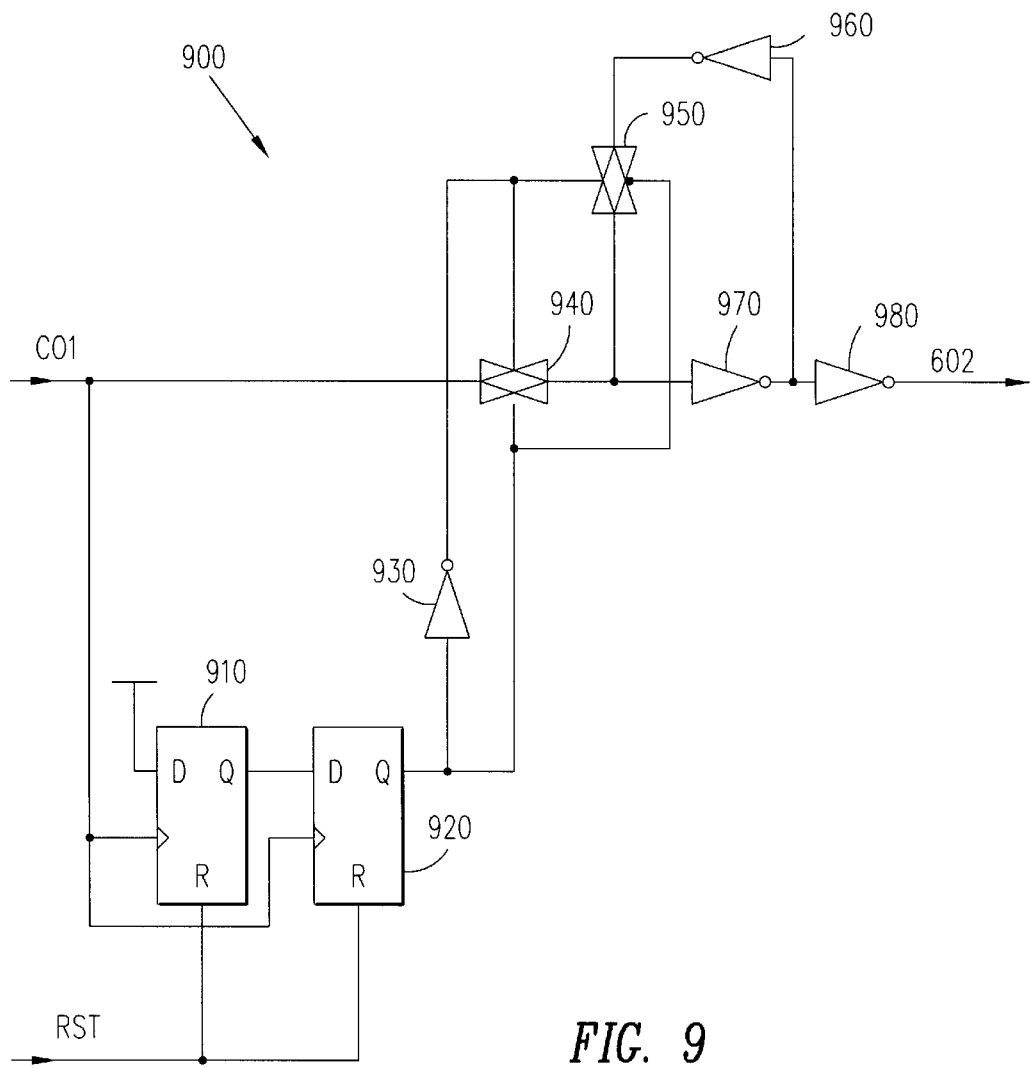

Inverter 890, provides the selected signal CO1 to deglitcher 900 shown in FIG. 9. Deglitcher 900 contains flip-flops 910 and 920 which are reset by signal RST from one-shot circuit 600 of FIG. 6. When reset, flip-flops 910 and 920 turn off a pass gate 940 and turn on a pass gate 950. Pass gate 940 is in a line between selection circuit 800 and inverters 970 and 980, so that when pass gate 940 is off, selection circuit 800 is disconnected from output inverters 970 and 980. When pass gate 950 is on, a loop is created which contains inverters 960 and 970. This loop maintains output pixel clock signal CO2 at a constant level which signal CO2 had when pass gate 950 was turned on and pass gate 940 was turned off.

Signal RST resets flip-flops 910 and 920 when circuits 500 and 800 begin selecting a new tap 514 to provide the output clock signal. During this time, pulses in signal CO1 may be irregular or short. Flip-flops 910 and 920 keep pass-gate 950 on, and therefore hold output pixel clock signal CO2 constant, until signal CO1 clocks flip-flops 910 and 920 twice. After clocking flip-flops 910 twice, signal CO1 should have settled into a regular oscillation from the new tap 514. Pass gate 940 is then turned on, and pass gate 950 is turned off so that pixel clock signal CO2 resumes oscillating with signal CO1.

Deglitcher 900 replaces short and/or irregular periods in signal CO1 with a long period in pixel clock signal CO2. Since these periods are during horizontal blanking or otherwise before active display, there is no effect on the pixel data. However, some applications may use pixel clock signal CO2 for the timing of video processing circuitry which is active during horizontal blanking, for example to count the number of pixels before opening a video window. In such applications, the period of every pulse of pixel clock signal CO2, must be long enough for proper operation of the processing circuitry. Deglitcher 900 ensures that this is the case.

Although the present invention has been described with reference to particular embodiments, the description is only an example of the invention's application and should not be taken as a limitation. In particular, even though much of preceding discussion was aimed at video signal alignment, alternative embodiments of this invention could be employed for synchronization among different processing chips in a computer or control system. In addition, although the description describes embodiments using inverters in delay lines and dynamic latches to sense delayed signals on the delay lines, many other devices could be used for these functions. Various other adaptations and combinations of features of the embodiments disclosed are within the scope of the invention as defined by the following claims.

We claim:

1. A synchronization circuit comprising:
   a plurality of delay line sections connected in series to form a delay line, each delay line section having a plurality of taps, wherein a clock signal applied to an end of the delay line provides a series of delayed signals at the taps, each delay line section delays the clock signal by less than a period of the clock signal, and the delay line delays the clock signal by more than the period of the clock signal;
   a plurality of selection units each coupled to taps in a corresponding delay line section, wherein each selection unit selects from among a plurality of delayed signals at the taps in the corresponding delay line section, and in response to one of the delayed signals having a desired phase relative to a transition in a reference signal, generates an output signal from that delayed signal; and
   a selection circuit which selects one of the output signals of the selection units and generates an output clock signal from the selected output signal.

2. The synchronization circuit of claim 1, wherein each selection unit comprises control logic which asserts a control signal to indicate that one of the delayed signals in the corresponding delay line section has the desired phase, wherein the selection circuit selects from among the output signals of selection units having asserted control signals.

3. The synchronization circuit of claim 2, wherein each selection unit comprises a series of latches, each latch coupled to a corresponding tap in the corresponding delay line section, wherein the transition in the reference signal triggers the latches and causes each latch to store a value which indicates a voltage at the corresponding tap when the latch was triggered.

4. The synchronization circuit of claim 3, further comprising a reference signal generator which generates one reference signal per the selection unit and simultaneously applies the reference signals to corresponding selection units.

5. A synchronization circuit comprising:
   a delay line which includes:
      delay elements connected in series;
      a first plurality of taps which are separated from each other by delay elements; and
      a second plurality of taps which are separated from each other by delay elements, wherein
      taps in the first plurality are interwoven with taps in the second plurality and each tap in the first plurality is separated from each tap in the second plurality of taps by at least one delay element;
   a series of latches, each latch having an input terminal coupled to a corresponding tap in the first plurality, wherein in response to a transition in a reference signal, each latch stores a value indicating a voltage level at the corresponding tap;
   a series of gates, each gate having an input terminal coupled to a corresponding tap in the second plurality; and
   selection logic which selects a tap in the second plurality and causes the gate connected to the selected tap to conduct a signal from the delay line, the selected tap being between a first tap which is coupled to a first latch storing a first value and a second tap which is coupled to a second latch storing a second value.

6. The synchronization circuit of claim 5, wherein each delay element comprises an inverter.

7. The synchronization circuit of claim 5, wherein each gate comprises a pass gate.

8. The synchronization circuit of claim 5, wherein:
   the delay line is partitioned into a plurality of delay line sections wherein each delay line section comprises a plurality of delay elements, wherein the delay line provides a total delay which is greater than one period of a clock signal applied to the delay line and each delay line section provides a delay which is less than one period of the clock signal;

the selection logic is partitioned into a plurality of selection units, wherein each selection unit has a corresponding delay line section and causes at most one gate coupled to the corresponding delay line section to conduct at a time; and the selection logic further comprises a selection circuit which selects as an output clock signal one of the signals conducted by the gates.

9. The synchronization circuit of claim 1, further comprising a deglitching circuit coupled to the output clock signal, wherein the deglitching circuit generates from the output clock signal a second output clock signal whose periods are more regular than the output clock signal.

* * * * *